(12) United States Patent
Fujii

(10) Patent No.: US 7,728,283 B2
(45) Date of Patent: Jun. 1, 2010

(54) ILLUMINANCE DETECTING APPARATUS COMPRISING A LIGHT SHIELDING ELEMENT CONTAINING OPENINGS FOR EACH DETECTOR ELEMENT

(75) Inventor: Tomoharu Fujii, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 12/041,840

(22) Filed: Mar. 4, 2008

(65) Prior Publication Data
US 2008/0217522 A1 Sep. 11, 2008

(30) Foreign Application Priority Data

Mar. 5, 2007 (JP) ............................. 2007-054706
May 11, 2007 (JP) ............................. 2007-126490

(51) Int. Cl.
*H01J 40/14* (2006.01)
*H01J 5/02* (2006.01)
(52) U.S. Cl. .................. 250/239; 250/216; 257/433; 257/434
(58) Field of Classification Search ................ 250/239, 250/216, 226; 257/431, 432, 433, 434
See application file for complete search history.

(56) References Cited

U.S. PATENT DOCUMENTS

| | | | |
|---|---|---|---|
| 5,286,605 A | 2/1994 | Nishioka et al. | |
| 6,057,538 A * | 5/2000 | Clarke | 250/208.1 |
| 6,630,661 B1 * | 10/2003 | Hoffman | 250/239 |
| 6,844,606 B2 * | 1/2005 | Logsdon et al. | 257/434 |
| 7,005,720 B2 * | 2/2006 | Huang et al. | 257/433 |
| 7,154,549 B2 * | 12/2006 | Shizukuishi | 348/315 |
| 2006/0186499 A1 * | 8/2006 | Maeda et al. | 257/432 |
| 2006/0243896 A1 * | 11/2006 | Chen | 250/239 |
| 2007/0241273 A1 * | 10/2007 | Kim et al. | 250/239 |

FOREIGN PATENT DOCUMENTS

JP  2007-027279  2/2007

* cited by examiner

*Primary Examiner*—Georgia Y Epps
*Assistant Examiner*—Francis M Legasse, Jr.
(74) *Attorney, Agent, or Firm*—Drinker Biddle & Reath LLP

(57) ABSTRACT

An illuminance detecting component includes: a supporting substrate including a substrate body made of silicon, and pads provided on an upper surface of the substrate body; a plurality of light receiving elements connected electrically to the pads and receiving light irradiated from an outside, the plurality of light receiving elements being arranged in array fashion on the upper surface side; external connection terminals connected electrically to the light receiving elements; and a translucent member provided on the substrate body. In the illuminance detecting component, an airtight space in which the plurality of light receiving elements are accommodated is formed between the translucent member and the substrate body.

18 Claims, 12 Drawing Sheets

(PRIOR ART)

(PRIOR ART)

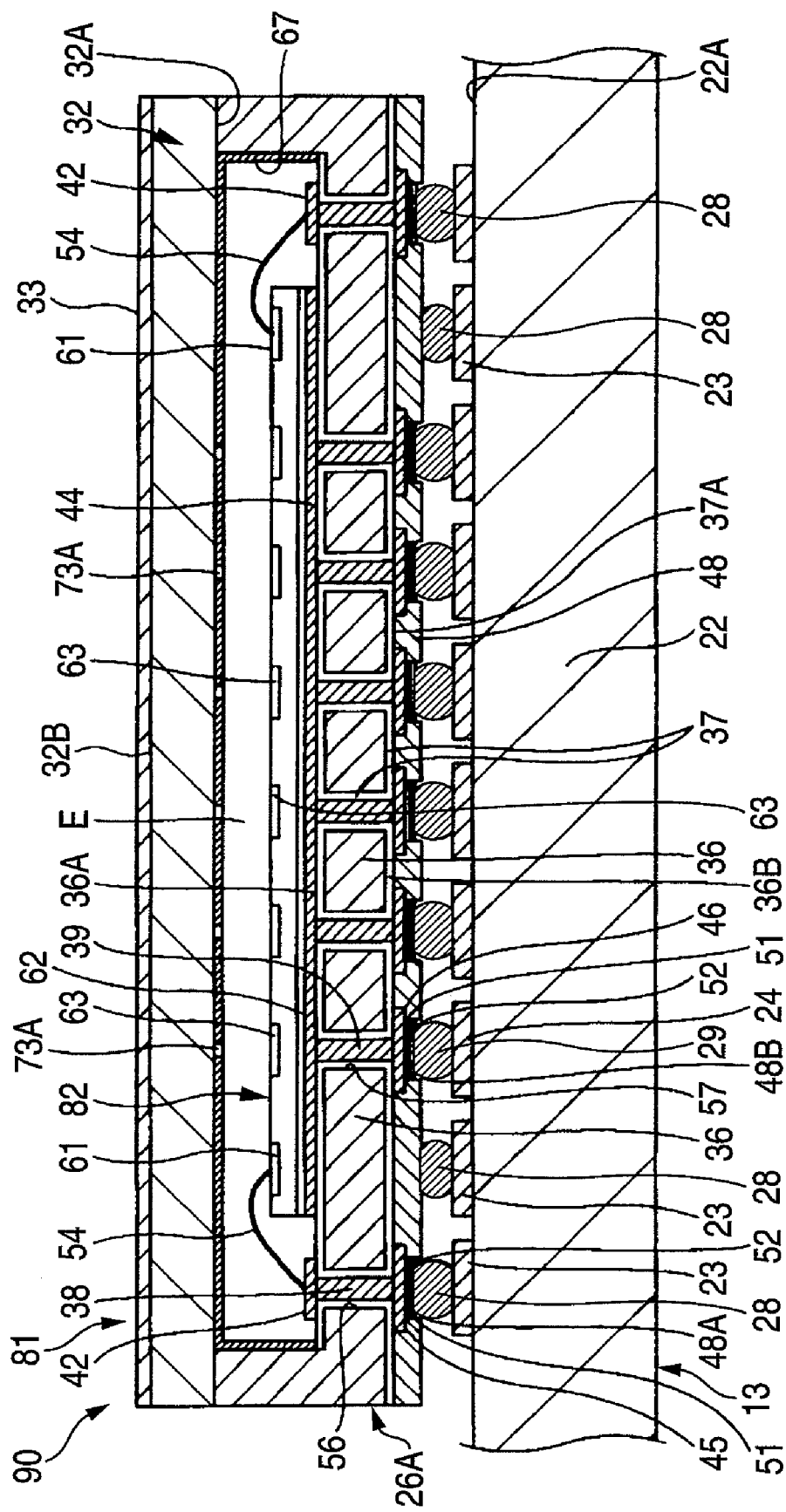

ILLUMINANCE DETECTING APPARATUS COMPRISING A LIGHT SHIELDING ELEMENT CONTAINING OPENINGS FOR EACH DETECTOR ELEMENT

This application is based on and claims priority from Japanese Patent Application No. 2007-054706, filed on Mar. 5, 2007, and No. 2007-126490, filed on May 11, 2007, the entire contents of which are hereby incorporated by reference.

BACKGROUND

1. Technical Field

The present disclosure relates to an illuminance detecting component and an illuminance detecting apparatus and, more particularly, to an illuminance detecting component and an illuminance detecting apparatus for detecting an illuminance of light irradiated from the outside.

2. Background Art

In the related art, in manufacturing a wiring substrate such as a printed board, as shown in FIG. 1, an exposure apparatus 100 having a Digital Micromirror Device (DMD) 106 is used for exposing a resist film or a film-like resist.

FIG. 1 is a schematic view of an exposure apparatus used in manufacturing a wiring substrate. Also, in FIG. 1, the exposure apparatus 100 can expose to light at a time in an area J (referred to as a "light irradiation area J" hereinafter), and K denotes a scanning direction of light (referred to as a "K direction" hereinafter).

By reference to FIG. 1, the exposure apparatus 100 includes a stage 101, a light source 105, the Digital Micromirror Device (DMD) 106, a light absorbing plate 107, and a projection lens 108.

The stage 101 is provided to fix a wiring substrate 102 on which a resist film 103 is formed. The light source 105 is disposed on the obliquely lower side of the DMD 106. The light source 105 is provided which radiates light onto the DMD 106.

The DMD 106 is provided over the stage 101 to face the wiring substrate 102. The DMD 106 has a plurality of micromirrors to receive the light emitted from the light source 105. When data (electric signal) corresponding to the pattern to be exposed is input, the DMD 106 tilts the micromirrors in response to the data to reflect the light emitted from the light source 105 to the resist film 103 and expose the resist film 103.

The light absorbing plate 107 is disposed on the obliquely lower side of the DMD 106. The light absorbing plate 107 is provided which absorbs the reflected light unnecessary for the exposure. The projection lens 108 is disposed between the DMD 106 and the wiring substrate 102. The projection lens 108 is provided which adjusts a light traveling direction, the light irradiation area J, and the like.

When exposure process of the resist film 103 is performed using the exposure apparatus 100 constructed as above, it is important to recognize an illuminance distribution of light in a plane of the wiring substrate 102 when the resist film 103 is patterned into a desired shape after the development process.

As the illuminance detecting apparatus for detecting an illuminance of light in a plane of the wiring substrate 102 in the related art, there is an illuminance detecting apparatus 112 shown in FIG. 2.

FIG. 2 is a view describing an illuminance detecting apparatus in the related art, and FIG. 3 is an enlarged sectional view of the illuminance detecting apparatus shown in FIG. 2. In FIG. 2, such a situation is schematically illustrated that the illuminance detecting apparatus 112 detects an illuminance of light irradiated from the exposure apparatus 100. Also, the illustration of wiring patterns 116, 117 shown in FIG. 3 will be omitted from FIG. 2. In FIG. 3, $P_A$ denotes an alignment pitch of photo diodes 122 (referred to as an "alignment pitch $P_A$" hereinafter) when a plurality of illuminance detecting units 114 are disposed at a predetermined interval.

By reference to FIG. 2, the illuminance detecting apparatus 112 in the related art includes an aligning plate 113 and a plurality of illuminance detecting units 114.

By reference to FIGS. 2 and 3, the aligning plate 113 is provided which aligns a plurality of illuminance detecting units 114 thereon and has a plate 115 and the wiring patterns 116, 117. The wiring patterns 116, 117 are formed on an upper surface 115A of the plate 115. The wiring patterns 116, 117 are connected electrically to the illuminance detecting units 114. The wiring patterns 116, 117 are wirings that lead detection signals that the illuminance detecting units 114 detect and also supply an electric power to the illuminance detecting units 114.

Each of the illuminance detecting units 114 includes a ceramic substrate 121, the photo diode 122, a ceramic frame 124, a glass substrate 126, and leads 128, 129. The plurality of illuminance detecting units 114 are disposed on the aligning plate 113 such that the photo diodes 122 are disposed at an alignment pitch $P_A$. The ceramic substrate 121 has a ceramic substrate body 131 and pads 133, 134. The pads 133, 134 are provided on an upper surface 131A of the ceramic substrate body 131.

The photo diode 122 is provided on the pad 134. The photo diode 122 has a positive electrode 136 and a light receiving portion 138 on its upper surface side, and has a negative electrode 137 on its lower surface side. The positive electrode 136 is connected electrically to the pad 133 via a wire 125. The light receiving portion 138 is provided to receive light which is reflected from the DMD 106 and then passes through the projection lens 108. The negative electrode 137 is disposed on the pad 134, and is connected electrically to the pad 134.

The ceramic frame 124 has a through hole 124A in which the photo diode 122 is accommodated. The ceramic frame 124 is provided on the pads 133, 134 and the upper surface 131A of the ceramic substrate body 131 so as to surround the photo diode 122.

The ceramic substrate 121 and the ceramic frame 124 as described above are formed by laminating a second green sheet in which the through hole 124A is formed (this green sheet constitutes the ceramic frame 124 after the sintering) on a first green sheet on which conductors acting as the pads 133, 134 are formed (this green sheet constitutes the ceramic substrate 121 after the sintering), and then sintering them.

The glass substrate 126 is shaped like a plate, and is provided on the ceramic frame 124. The glass substrate 126 is provided to pass through the light irradiated from the exposure apparatus 100 and also to seal tightly a space L in which the photo diode 122 is accommodated.

The lead 128 is connected to a portion, which is positioned on the outside of the ceramic frame 124, of the pad 133. The lead 128 is the external connection terminal of the illuminance detecting unit 114, and is connected electrically to the wiring pattern 116 via a solder 141. Thus, the wiring pattern 116 is connected electrically to the positive electrode 136 of the photo diode 122.

The lead 129 is connected to a portion, which is positioned on the outside of the ceramic frame 124, of the pad 134. The lead 129 is the external connection terminal of the illuminance detecting unit 114, and is connected electrically to the wiring pattern 117 via a solder 142. Thus, the wiring pattern 117 is connected electrically to the negative electrode 137 of the photo diode 122 (see e.g., Japanese Patent Application Publication No. 2007-27279).

However, according to the illuminance detecting apparatus 112 in the related art, the plurality of illuminance detecting units 114 on which one photo diode 122 is provided respectively are disposed on the aligning plate 113, and therefore it is difficult to narrow the alignment pitch PA of the photo diodes 122. As a result, such a problem existed that a detailed distribution of an illuminance of light irradiated from the exposure apparatus 100 cannot be detected.

SUMMARY

One or more exemplary embodiments of the present invention provide an illuminance detecting component and an illuminance detecting apparatus that can detect a detailed distribution of an illuminance of light irradiated from the outside.

According to one or more exemplary embodiments of the present invention, an illuminance detecting component comprises:
a supporting substrate comprising:
a substrate body made of silicon; and
pads provided on an upper surface of the substrate body;
a plurality of light receiving elements connected electrically to the pads and receiving light irradiated from an outside, said plurality of light receiving elements being arranged in array fashion on the upper surface side;
external connection terminals connected electrically to the light receiving elements; and
a translucent member provided on the substrate body, wherein
an airtight space in which the plurality of light receiving elements are accommodated is formed between the translucent member and the substrate body.

According to the exemplary embodiments, the plurality of light receiving elements are arranged on said one supporting substrate in array fashion, and thus an alignment pitch of the light receiving elements can be narrowed. Therefore, a detailed distribution of the illuminance of light irradiated from the outside can be detected. Also, the substrate body is formed of silicon, and thus warpage can be suppressed in the substrate body. Therefore, the plurality of light receiving elements can be arranged in desired positions of the supporting substrate with high precision, and thus reliability of the illuminance of light being detected by the plurality of light receiving elements can be improved. Moreover, the translucent member has a recess for accommodating the plurality of light receiving elements therein, and is provided on the substrate body to seal a space formed by the recess in an airtight manner. Therefore, contamination of the space, in which the plurality of light receiving elements are accommodated, by an outer air can be prevented.

According to one or more exemplary embodiments of the present invention, the pads may be formed of a plating film. Therefore, a size of the pads can be formed smaller than the case where the pads are formed by sintering the green sheet on which the conductors are formed (the case where the substrate body is made of ceramic). Therefore, the alignment pitch of the plurality of light receiving elements can be further narrowed.

According to one or more exemplary embodiments of the present invention, each of the plurality of light receiving elements may have a light receiving portion for receiving said light, and a light shielding member for shielding the light may be provided on a first surface of the translucent member opposing to the light receiving elements, and openings for passing the light may be provided on portions of the light shielding member opposing to the light receiving portions. Therefore, the plurality of light receiving elements can detect only the illuminance of light irradiated to the aligned position of each of the light receiving elements respectively. As a result, the illuminance of light in a narrow range can be detected.

According to one or more exemplary embodiments of the present invention, a diameter of each of the openings may be smaller than that of each of effective areas of the light receiving portions. Therefore, the light is never irradiated to the light receiving portion except the effective area. As a result, reliability of the illuminance of light being detected by a plurality of light receiving elements can be improved.

According to one or more exemplary embodiments of the present invention, the translucent member may be made of glass, and the substrate body and the translucent member may be anode-bonded to each other. Therefore, the space in which a plurality of light receiving elements are housed can be sealed in an airtight manner.

According to one or more exemplary embodiments of the present invention, the supporting substrate may further comprise through vias provided to pass through the substrate body, and connected electrically to the pads, and ends of the through vias positioned on a lower surface opposite to the upper surface of the substrate body may be connected electrically to the external connection terminals. Therefore, a size reduction of the illuminance detecting component can be achieved rather than the conventional illuminance detecting component in which the leads are used as the external connection terminals.

According to one or more exemplary embodiments of the present invention, an antireflective coating may be formed on a second surface of the translucent member opposite to the first surface so as to prevent such a situation that said light is reflected at the second surface. Therefore, real illuminance corresponding to the irradiated light can be detected.

According to one or more exemplary embodiments of the present invention, an illuminance detecting apparatus comprises:
a plurality of the illuminance detecting components; and
an aligning plate comprising:
a plate whose outer shape is substantially equal to a wiring substrate exposed by an exposure apparatus; and
wiring patterns provided on the plate and connected electrically to the external connection terminals provided in the illuminance detecting components.

According to one or more exemplary embodiments of the present invention, an illuminance detecting component comprises:
a supporting substrate;
a light receiving element disposed on the supporting substrate and having a plurality of light receiving portions for receiving light irradiated from an outside;
a translucent member bonded to the supporting substrate such that the light receiving element is sealed airtightly in a space formed between the translucent member and the supporting substrate, the translucent member being formed of a material for transmitting said light; and
external connection terminals connected electrically to the light receiving elements,
wherein
the plurality of light receiving portions are formed in array fashion on said one light receiving element.

According to the exemplary embodiments, the plurality of light receiving portions are formed in array fashion on said one light receiving element disposed on the supporting substrate, and thus an alignment pitch of the light receiving element can be further narrowed. Therefore, a detailed distribution of the illuminance of light irradiated from the outside can be detected. Moreover, in the exemplary embodiments, it is not necessary to mount a plurality of light receiving elements on the supporting substrate with alignment. Therefore, since said only one light receiving element is mounted on the supporting substrate, simplification of the assembling operation can be achieved.

According to one or more exemplary embodiments of the present invention, the supporting substrate and the translucent member may be anode-bonded to each other. Therefore, the space in which the light receiving element is accommodated can be sealed in an airtight manner without using adhesive agent.

According to one or more exemplary embodiments of the present invention, the translucent member have a recess for accommodating the light receiving element therein when the supporting substrate is shaped like a flat plate. Also, the supporting substrate has a recess for accommodating the light receiving element therein when the translucent member is shaped like a flat plate. Thus, the recess may be formed either on the translucent member or on the supporting substrate.

According to one or more exemplary embodiments of the present invention, the supporting substrate may have a substrate body made of silicon, and the translucent member may be made of glass. Since the substrate body is formed of silicon, warpage can be suppressed in the substrate body. Therefore, the light receiving element can be arranged in desired positions of the supporting substrate with high precision, and thus reliability of the illuminance of light being detected by the plurality of light receiving elements can be improved. Moreover, since the translucent member is made of glass, anode bonding can be surely achieved.

According to the present invention, a plurality of light receiving elements can be aligned at a narrow alignment pitch. Therefore, a detailed distribution of an illuminance of light can be detected.

According to the present invention, a detailed distribution of an illuminance of light irradiated from the outside can be detected.

Other aspects and advantages of the invention will be apparent from the following description, the drawings and the claims.

BRIEF DESCRIPTION OF THE DRAWINGS

FIG. 12 is a sectional view of an illuminance detecting apparatus according to a fourth embodiment of the present invention.

DETAILED DESCRIPTION

Exemplary embodiments of the present invention will be described with reference to the drawings hereinafter.

First Embodiment

Figure 4:
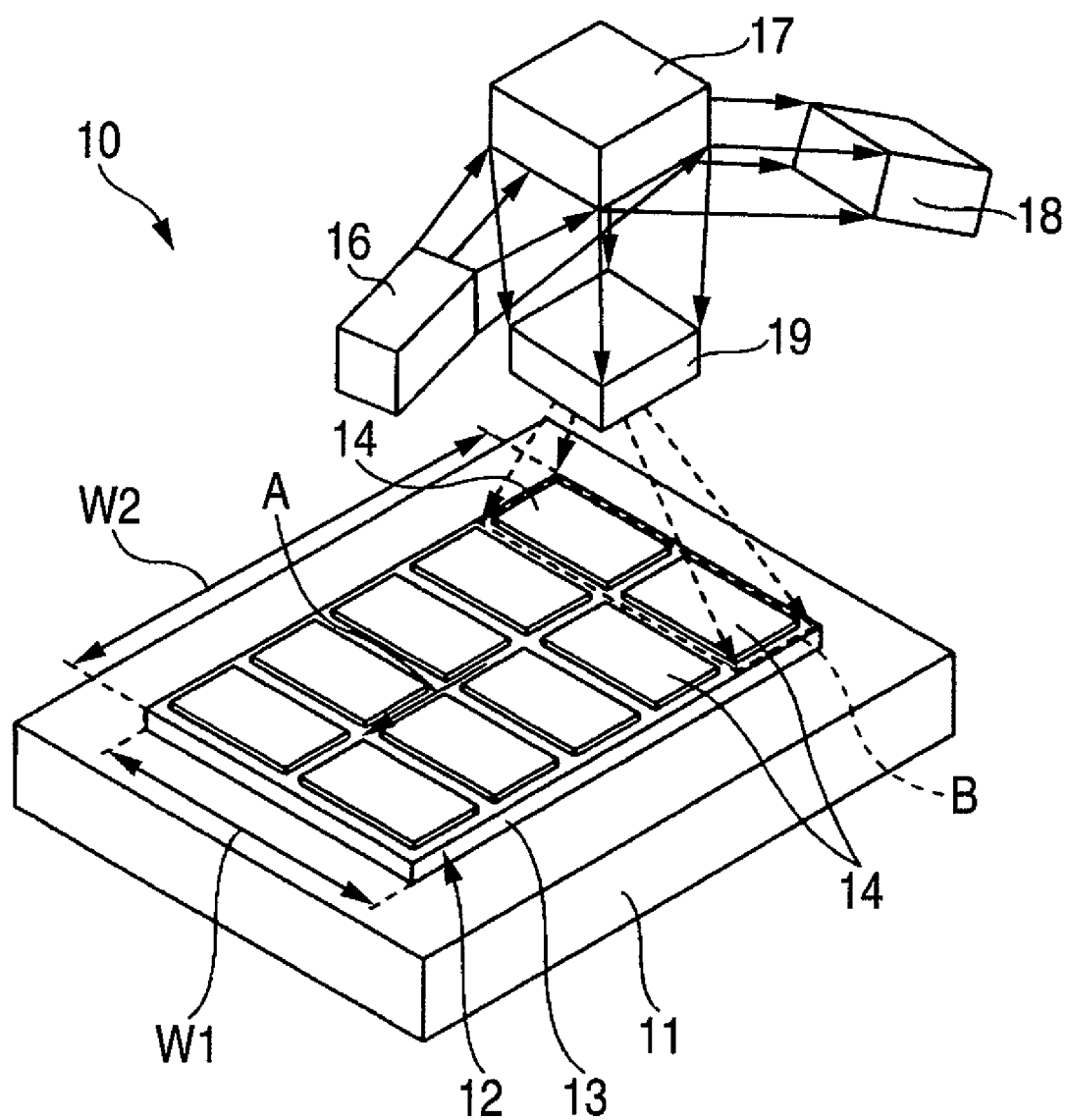
FIG. 4 is a schematic view of an exposure apparatus using an illuminance detecting apparatus according to a first embodiment of the present invention.

FIG. 4 is a schematic view of an exposure apparatus using an illuminance detecting apparatus according to a first embodiment. In FIG. 4, an illuminance of light irradiated from an exposure apparatus 10 is detected by an illuminance detecting apparatus 12 fixed on a stage 11. Also, in FIG. 4, A denotes a scanning direction of light, and B denotes an area where the exposure apparatus 10 can irradiate light at a time (referred to as a "light irradiation area B" hereinafter).

At first, by reference to FIG. 4, the exposure apparatus 10 using the illuminance detecting apparatus 12 according to the first embodiment will be described hereunder. The exposure apparatus 10 is equipped with the stage 11, a light source 16, a DMD 17, a light absorbing plate 18, and a projection lens 19.

The stage 11 is provided which fixes a wiring substrate (not shown), on which a resist film is formed, and the illuminance detecting apparatus 12. The light source 16 is disposed on the obliquely lower side of the DMD 17. The light source 16 is provided which irradiates light onto the DMD 17.

The DMD 17 is disposed over the stage 11 to oppose to the illuminance detecting apparatus 12. The DMD 17 has a plurality of micromirrors (not shown) to receive the light emitted from the light source 16. When data (electric signal) corresponding to the pattern to be exposed is input, the DMD 17 tilts the micromirrors in response to the data to reflect the light emitted from the light source 16 to the illuminance detecting apparatus 12 fixed to the stage 11 (to the resist film when the wiring substrate (not shown) on which the resist film is formed is fixed on the stage 11).

The light absorbing plate 18 is disposed on the obliquely lower side of the DMD 17. The light absorbing plate 18 is provided to absorb the reflected light unnecessary for the exposure. The projection lens 19 is disposed between the DMD 17 and the illuminance detecting apparatus 12. The projection lens 19 is disposed to adjust a traveling direction and the light irradiation area B of the light reflected to the DMD 17.

Figure 5:
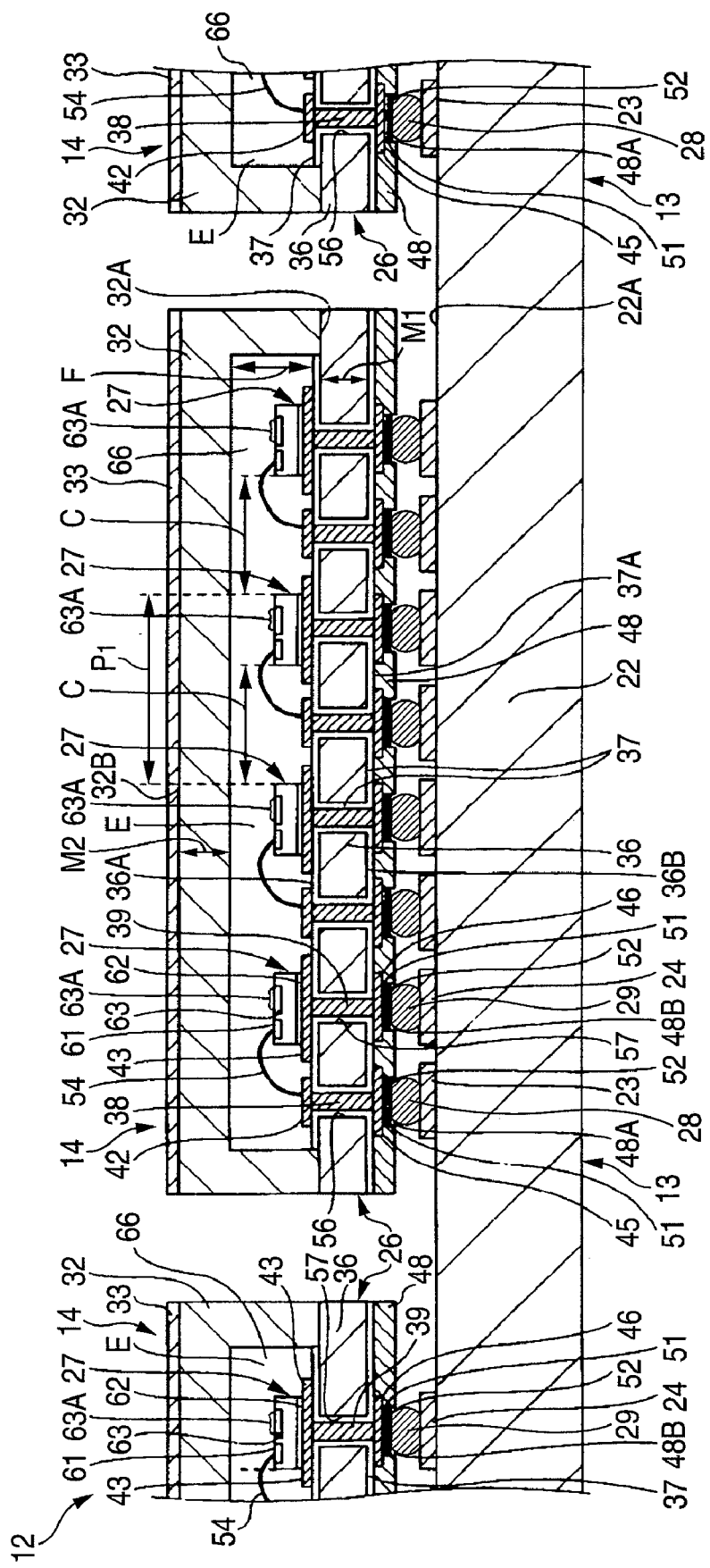
FIG. 5 is a sectional view of the illuminance detecting apparatus according to the first embodiment of the present invention.

FIG. 5 is a sectional view of the illuminance detecting apparatus according to the first embodiment of the present invention. In FIG. 5, the same reference symbols are affixed to the same constituent portions as the configuration shown in FIG. 4.

By reference to FIG. 5, the illuminance detecting apparatus 12 of the first embodiment has an aligning plate 13 and a plurality of illuminance detecting components 14. The aligning plate 13 has a plate 22 and a plurality of wiring patterns 23 and 24. The plate 22 is a supporting plate on which a plurality of illuminance detecting components 14 are provided. The plate 22 is substantially equal to an outer shape of a wiring substrate (not shown) that is exposed by the exposure apparatus 10 when viewed from the top. When a size of the wiring substrate (not shown) that is exposed by the exposure apparatus 10 is 50 cm×80 cm, a width W1 of the plate 22 may be set to 50 cm, for example. In this case, a width W2 of the plate 22 may be set to 80 cm, for example.

The plurality of wiring patterns 23, 24 are provided on an upper surface 22A of the plate 22. The wiring pattern 23 is connected to an external connection terminal 28, and the external connection terminal 28 is connected electrically to a positive electrode 61 of a light receiving element 27 as described later. The wiring pattern 24 is connected to an external connection terminal 29 that is connected electrically to a negative electrode 62 of the light receiving element 27 as described later. The plurality of wiring patterns 23 and 24 supply an electric power to a plurality of the light receiving elements 27 provided to the plurality of illuminance detecting components 14, and lead the detection signals that the light receiving elements 27 detect to the outside when the light is irradiated onto the light receiving elements 27.

The plurality of illuminance detecting components 14 are arranged on the aligning plate 13 at a predetermined interval. Each of the illuminance detecting components 14 has a supporting substrate 26, the plurality of light receiving elements 27, the external connection terminals 28 and 29, a translucent member 32, and an antireflective coating 33 (hereafter referred as to AR coating 33).

The supporting substrate 26 is a substrate on which the plurality of light receiving elements 27 are mounted, and has a substrate body 36, an insulating film 37, through vias 38 and 39, pads 42 and 43, external connection pads 45 and 46, a solder resist 48, an Ni layer 51, and an Au layer 52.

Figure 6:
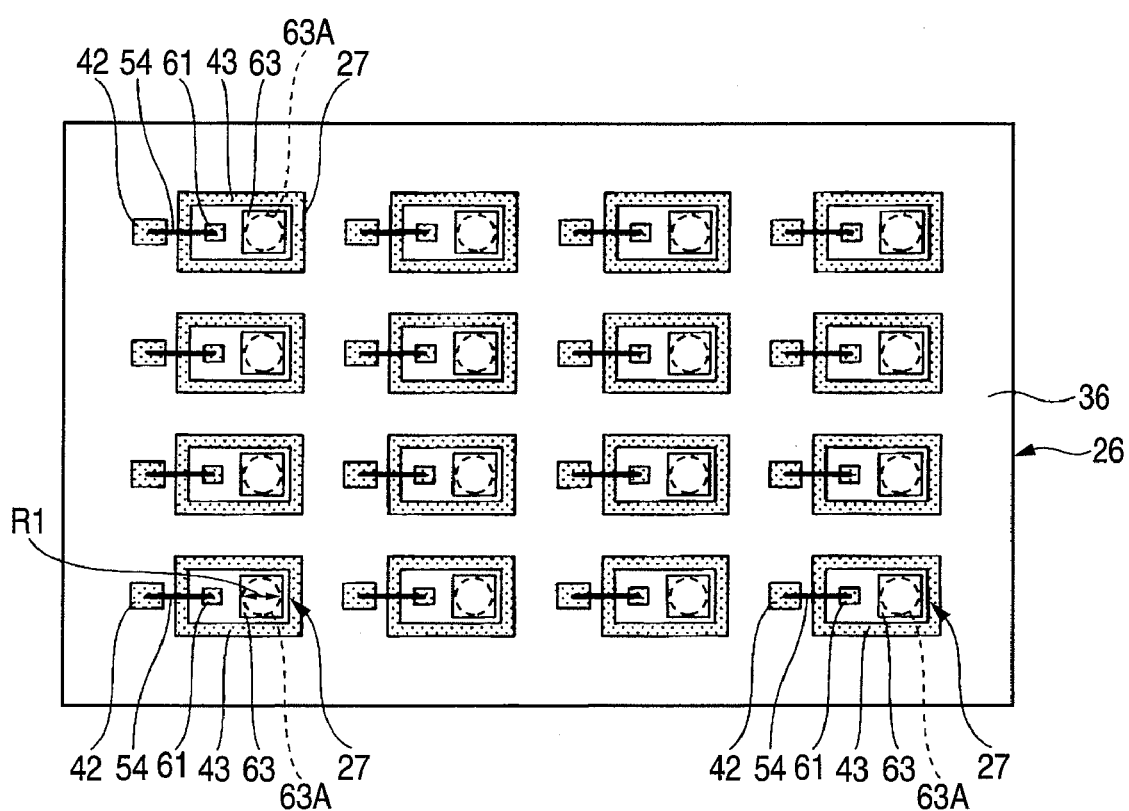
FIG. 6 is a plan view of a supporting substrate where a plurality of light receiving elements are arranged.

FIG. 6 is a plan view of a supporting substrate on which the plurality of light receiving elements 27 are arranged. In FIG. 6, the same reference symbols are affixed to the same constituent portions as those of the illuminance detecting component 14 shown in FIG. 5.

By reference to FIGS. 5 and 6, the substrate body 36 is formed like a square plate when viewed from the top, and has a plurality of through holes 56 and 57. The through hole 56 is formed to provide the through via 38, and the through hole 57 is formed to provide the through via 39. The substrate body 36 is made of silicon. Concretely, a silicon substrate can be used as the substrate body 36. A thickness M1 of the substrate body 36 may be set to 200 µm to 500 µm, for example.

In this manner, because the substrate body 36 is made of silicon, warpage is suppressed in the substrate body 36 (rather than the ceramic plate). Therefore, the plurality of light receiving elements 27 can be arranged in desired positions of the supporting substrate 26 with high precision. As a result, reliability of an illuminance of light detected by the plurality of light receiving elements 27 can be improved.

The insulating film 37 is provided on an upper surface 36A and a lower surface 36B of the substrate body 36, and surfaces of portions of the substrate body 36 corresponding to the through holes 56 and 57. The insulating film 37 is a film which insulates the through vias 38 and 39, the pads 42 and 43, and the external connection pads 45 and 46 from the substrate body 36. As the insulating film 37, for example, an oxide film can be used. When the oxide film is used as the insulating film 37, the oxide film may be formed by thermally oxidizing the substrate body 36 in which the through holes 56 and 57 are formed, for example.

The through via 38 is provided in the through hole 56 on which the insulating film 37 is formed. An upper end portion of the through via 38 is connected to the pad 42, and a lower end portion of the through via 38 is connected to the external connection pad 45. The through via 38 is provided to connect electrically the pad 42 and the external connection pad 45.

The through via 39 is provided in the through hole 57 on which the insulating film 37 is formed. An upper end portion of the through via 39 is connected to the pad 43, and a lower end portion of the through via 39 is connected to the external connection pad 46. The through via 39 is provided to connect electrically the pad 43 and the external connection pad 46. As the material of the through vias 38 and 39, for example, Cu may be used. Also, the through vias 38 and 39 may be formed by the plating method.

The pad 42 is provided to extend over a portion of the insulating film 37, which corresponds to a position where an upper end portion of the through via 38 is formed, from the upper end portion of the through via 38. The pad 42 is connected to the through via 38. Also, the pad 42 is connected electrically to the positive electrode 61 of the light receiving element 27 via a metal wire 54.

The pad 43 is provided to extend over a portion of the insulating film 37, which corresponds to a position where an upper end portion of the through via 39 is formed, from the upper end portion of the through via 39. A plurality of the pads 43 are arranged in array fashion when the supporting substrate 26 is viewed from the top. The pad 43 is connected to the through via 39, and is connected electrically to the negative electrode 62 of the light receiving element 27. As the material of the pads 42, 43, for example, Cu may be used. Also, the pads 42, 43 may be formed by the plating method. As the plating method, for example, the semi-additive method, the subtractive method, and the like may be used.

In this manner, the pads 42, 43 to which the light receiving element 27 is connected are formed by the plating method. Therefore, dimensional precision of the pads 42 and 43 can be improved, as compared with the case where the conductor acting as the pad is formed on the green sheet and then the pad is formed by sintering the green sheet on which the conductor is formed.

Accordingly, an alignment pitch $P_1$ of the light receiving elements 27 arranged on the supporting substrate 26 can be made small by reducing a size of the pads 42 and 43. Therefore, a detailed distribution of an illuminance of light irradiated from the exposure apparatus 10 can be detected.

The external connection pad 45 is provided to extend over a portion of the insulating film 37, which corresponds to a position where a lower end portion of the through via 38 is formed, from the lower end portion of the through via 38. The external connection pad 45 is connected to the through via 38. The external connection pad 45 is connected electrically to the positive electrode 61 of the light receiving element 27 via the metal wire 54, the pad 42, and the through via 38.

The external connection pad 46 is provided to extend over a portion of the insulating film 37, which corresponds to a position where a lower end portion of the through via 39 is formed, from the lower end portion of the through via 39. The external connection pad 46 is connected to the through via 39. The external connection pad 46 is connected electrically to the negative electrode 62 of the light receiving element 27 via the pad 43 and the through via 39. As the material of the external connection pads 45, 46, for example, Cu may be used.

The solder resist 48 is provided on a lower surface 37A of the insulating film 37 formed on the lower surface 36B side of the substrate body 36. The portion of the solder resist 48 except the portion corresponding to the area where the Ni layer 51 is formed (as described later) is disposed to cover the external connection pad 45. Also, the solder resist 48 has openings 48A and 48B that expose the portions, which correspond to the area where the Ni layer 51 is formed, of the external connection pads 45 and 46 respectively.

The Ni layer 51 is provided on portions of the external connection pads 45 and 46 exposed from the openings 48A and 48B respectively. The Ni layer 51 is provided to prevent diffusion of Cu contained in the external connection pads 45 and 46 into the Au layer 52 and the external connection terminals 28 and 29 provided on the lower surface of the Ni layer 51. A thickness of the Ni layer 51 may be set to 3 μm, for example.

The Au layer 52 is provided on the lower surface of the Ni layer 51. The Au layer 52 is provided to improve adhesion to the external connection terminals 28 and 29. A thickness of the Au layer 52 may be set to 1 μm, for example.

The plurality of light receiving elements 27 are the elements for detecting an illuminance of light irradiated from the exposure apparatus 10, and are provided on the plurality of pads 43 formed on the substrate body 36. The plurality of light receiving elements 27 are arranged in array fashion when the substrate body 36 is viewed from the top.

Figure 1:
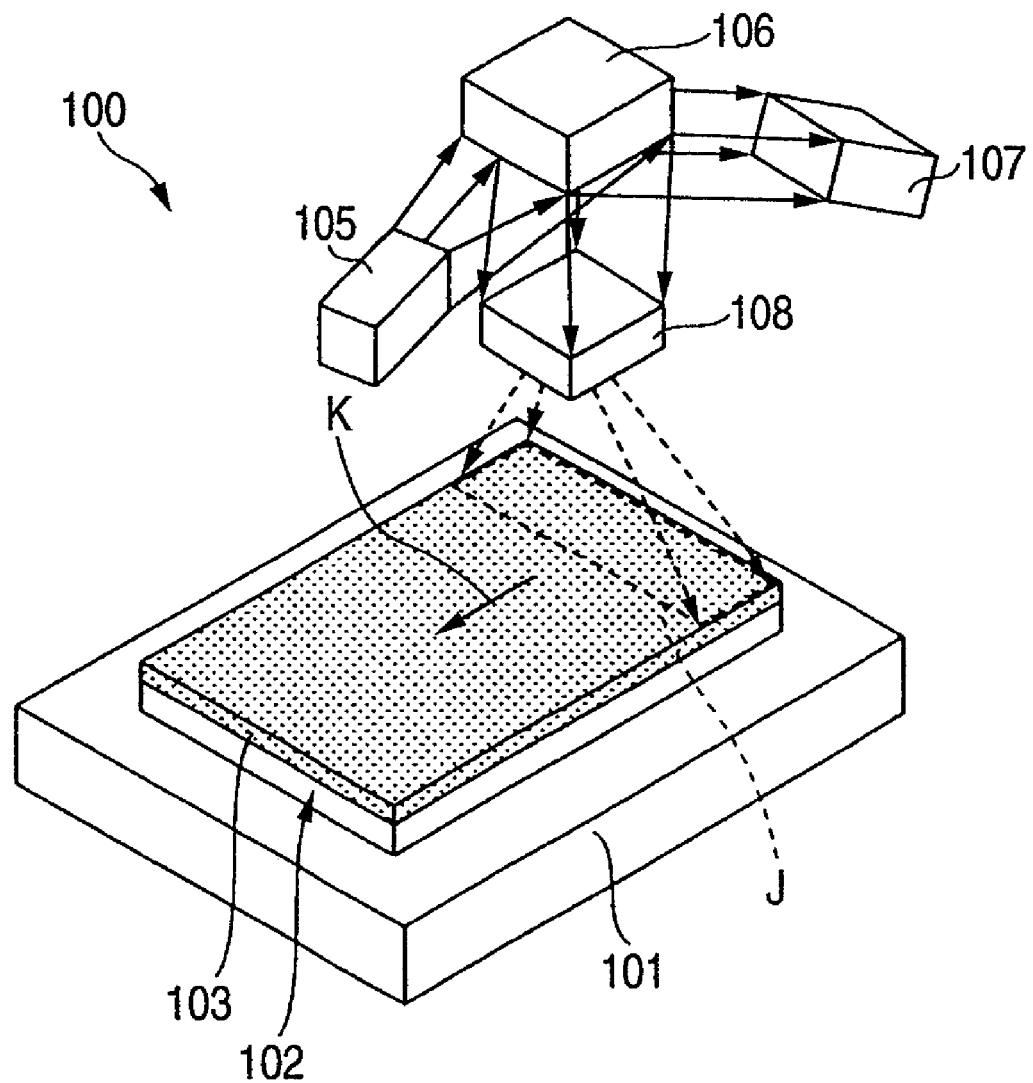
FIG. 1 is a schematic view of an exposure apparatus used in manufacturing a wiring substrate.
Figure 2:
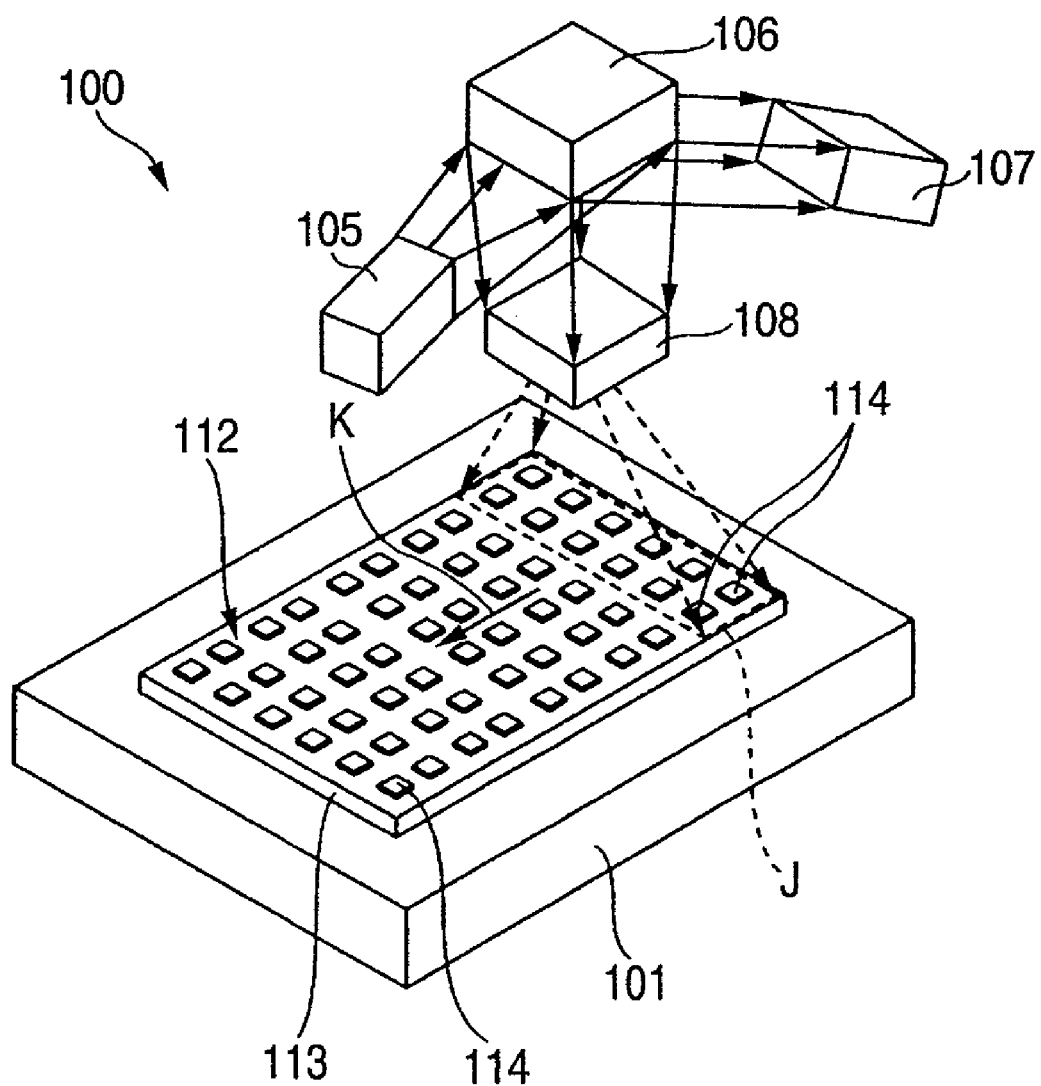
FIG. 2 is a view describing an illuminance detecting apparatus in the related art.
Figure 3:
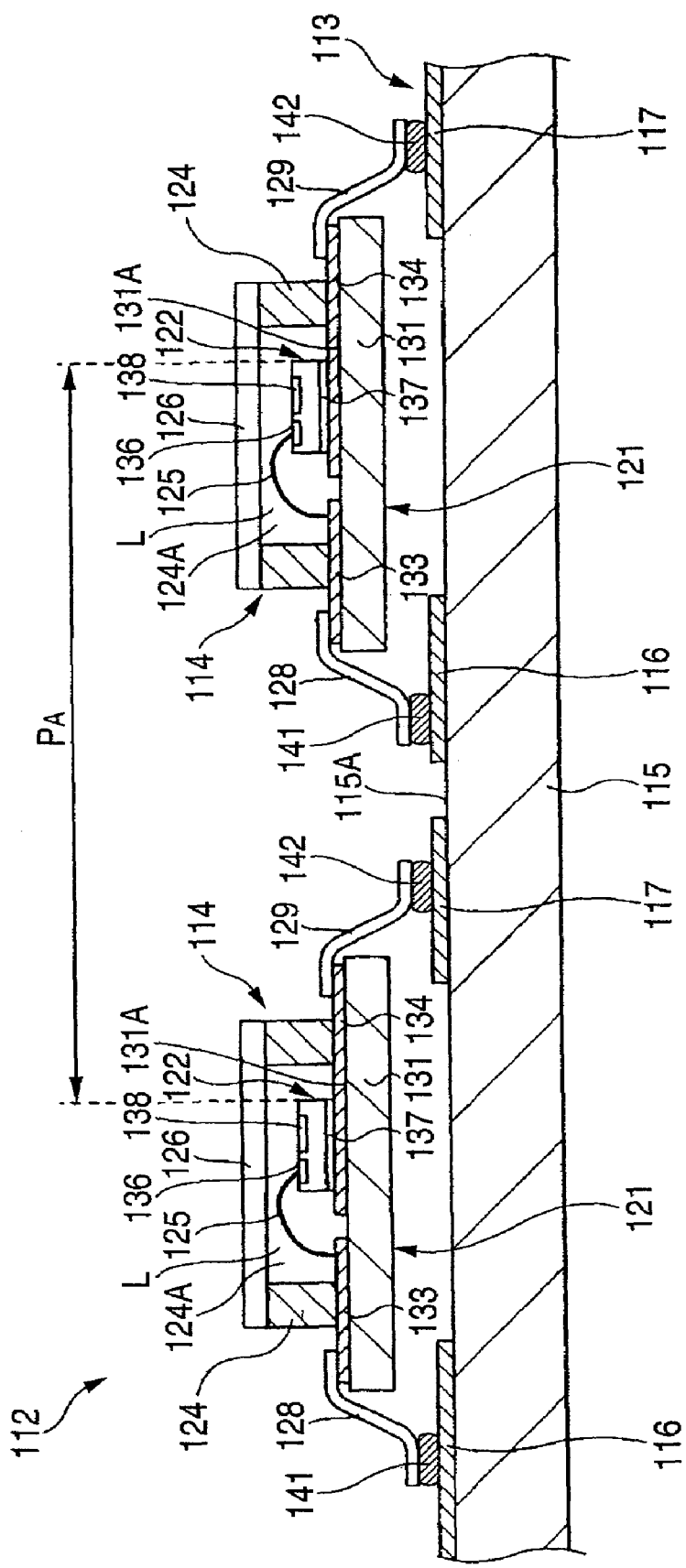
FIG. 3 is an enlarged sectional view of the illuminance detecting apparatus shown in FIG. 2.

In this manner, the plurality of light receiving elements 27 are arranged on one substrate body 36, whereby the alignment pitch $P_1$ of the light receiving elements 27 can be narrowed in contrast to the illuminance detecting component 114 that has only one photo diode 122 (see FIG. 3). As a result, an illuminance distribution of light irradiated from the exposure apparatus 10 can be detected in details. In this case, a minimum value of a distance C between the neighboring light receiving elements 27 may be set to 250 μm, for example.

The light receiving element 27 has the positive electrode 61, the negative electrode 62, and a light receiving portion 63. The positive electrode 61 is provided on the upper surface side (the light receiving side) of the light receiving element 27. The positive electrode 61 is connected to the metal wire 54. The positive electrode 61 is connected electrically to the pad 42 via the metal wire 54. The negative electrode 62 is provided on the lower surface side of the light receiving element 27. The negative electrode 62 is fixed on the pad 43, and is connected electrically to the pad 43. The negative electrode 62 may be fixed on the pad 43 with the conductive adhesive, for example.

The light receiving portion 63 is provided on the upper surface side of the light receiving element 27. The light receiving portion 63 opposes to the translucent member 32 so as to receive the light irradiated from the exposure apparatus 10. The light receiving portion 63 has an effective area 63A where illuminance value is detected with high reliability. A diameter R1 of the effective area 63A may be set to ϕ0.8 mm, for example. As the light receiving element 27 constructed as above, for example, the photo diode may be used.

The external connection terminal 28 is provided on the Au layer 52 exposed from the opening portion 48A. The external connection terminal 28 is connected to the wiring pattern 23 provided to the aligning plate 13. The external connection terminal 28 is the terminal that connects electrically the positive electrode 61 of the light receiving element 27 and the wiring pattern 23.

The external connection terminal 29 is provided on the Au layer 52 exposed from the opening portion 48B. The external connection terminal 29 is connected to the wiring pattern 24 provided to the aligning plate 13. The external connection terminal 29 is the terminal that connects electrically the negative electrode 62 of the light receiving element 27 and the wiring pattern 24. As the external connection terminals 28 and 29, for example, the solder ball may be used.

In this manner, the external connection terminals 28 and 29 of the illuminance detecting component 14 are disposed on the lower surface side of the supporting substrate 26. Thus, a size reduction of the illuminance detecting component 14 can be achieved compared with the case where the leads 128 and 129 (see FIG. 3) are used as the external connection terminals.

The translucent member 32 is bonded to the upper surface 36A of the substrate body 36 positioned around the outer periphery of the substrate body 36. The translucent member 32 has a recess 66 that accommodates the plurality of light receiving elements 27 therein. A depth F of the recess 66 (a depth obtained when a face 32A of the translucent member 32 contacting the substrate body 36 is selected as a reference point) may be set to 600 μm, for example. Moreover, a thickness M2 of the portion of the translucent member 32 corresponding to a bottom portion of the recess 66 may be set to 500 μm, for example.

A space E is formed between the translucent member 32 for accommodating the plurality of light receiving elements 27 therein and the supporting substrate 26 by the recess 66. The translucent member 32 is provided to airtightly seal the space E. As the material of the translucent member 32, for example, a glass may be used. When the glass is used as the material of the translucent member 32, the translucent member 32 and the substrate body 36 made of silicon may be anode bonded.

In this manner, the space E in which a plurality of light receiving elements 27 are accommodated can be sealed in an airtight manner by anode-bonding the translucent member 32 and the substrate body 36. Thus, it can be prevented that the space E is contaminated.

The AR coating 33 is provided to cover a face 32B (a face where the light emitted from the exposure apparatus 10 is irradiated) of the translucent member 32. The AR coating 33 is provided to pass effectively the light irradiated from the exposure apparatus 10 through the translucent member 32, by preventing such a situation that the light irradiated from the exposure apparatus 10 is reflected at the face 32B of the translucent member 32. As the AR coating 33, $Ta_2O_5/SiO_2$ multilayer film may be used, and the $Ta_2O_5/SiO_2$ multilayer film is formed by stacking a $Ta_2O_5$ film and a $SiO_2$ film on the face 32B of the translucent member 32 in order. The $Ta_2O_5/SiO_2$ multilayer film may be formed by the sputter method, the vapor deposition method. A thickness of the $Ta_2O_5$ film may be set to 0.2 Å, for example. Moreover, a thickness of the $SiO_2$ film may be set to 0.13 Å, for example.

In this manner, the AR coating 33 is provided on the face 32B of the translucent member 32. As a result, an illuminance corresponding to the light that is irradiated actually from the exposure apparatus 10 can be detected.

According to the illuminance detecting component of the present embodiment, since the plurality of light receiving elements 27 are arranged on one supporting substrate 26 in array fashion, the alignment pitch $P_1$ of the light receiving elements 27 can be narrowed. Therefore, the illuminance distribution of light irradiated from the exposure apparatus 10 can be detected in details. Also, since the substrate body 36 is made of silicon, warpage can be suppressed in the substrate body 36. Therefore, the plurality of light receiving elements 27 can be arranged in desired positions of the supporting substrate 26 with high precision, and thus reliability of the illuminance of light being detected by the plurality of light receiving elements 27 can be improved. Also, since the substrate body 36 is made of silicon, the pads 42, 43 may be formed by the plating method. Therefore, a size of the pads 42, 43 can be reduced. As a result, a detailed distribution of the illuminance of light irradiated from the exposure apparatus 10 can be detected with high precision by further narrowing the alignment pitch $P_1$ of the light receiving elements 27.

Also, according to the illuminance detecting apparatus of the present embodiment, in the plurality of illuminance detecting components 14, the plurality of light receiving elements 27 are arranged on the supporting substrate 26. Moreover, the plurality of illuminance detecting components 14 has the substrate body 36 made of silicon, and are provided in array fashion on the plate 22 whose outer shape is substantially equal to the wiring substrate that is exposed by the exposure apparatus 10. Therefore, the alignment pitch $P_1$ of the light receiving elements 27 can be narrowed in contrast to the illuminance detecting apparatus 112 (see FIG. 3) in the related art. As a result, the illuminance distribution of light irradiated from the exposure apparatus 10 can be detected in details.

In the present embodiment, while there has been described the case where the illuminance of light irradiated from the exposure apparatus 10 is detected, the light detected by the illuminance detecting apparatus 12 and the illuminance detecting component 14 is not limited to the present embodiments. For example, the illuminance of light irradiated from the ultraviolet irradiation equipment may be detected by the illuminance detecting apparatus 12 and/or the illuminance detecting component 14.

Second Embodiment

Figure 7:
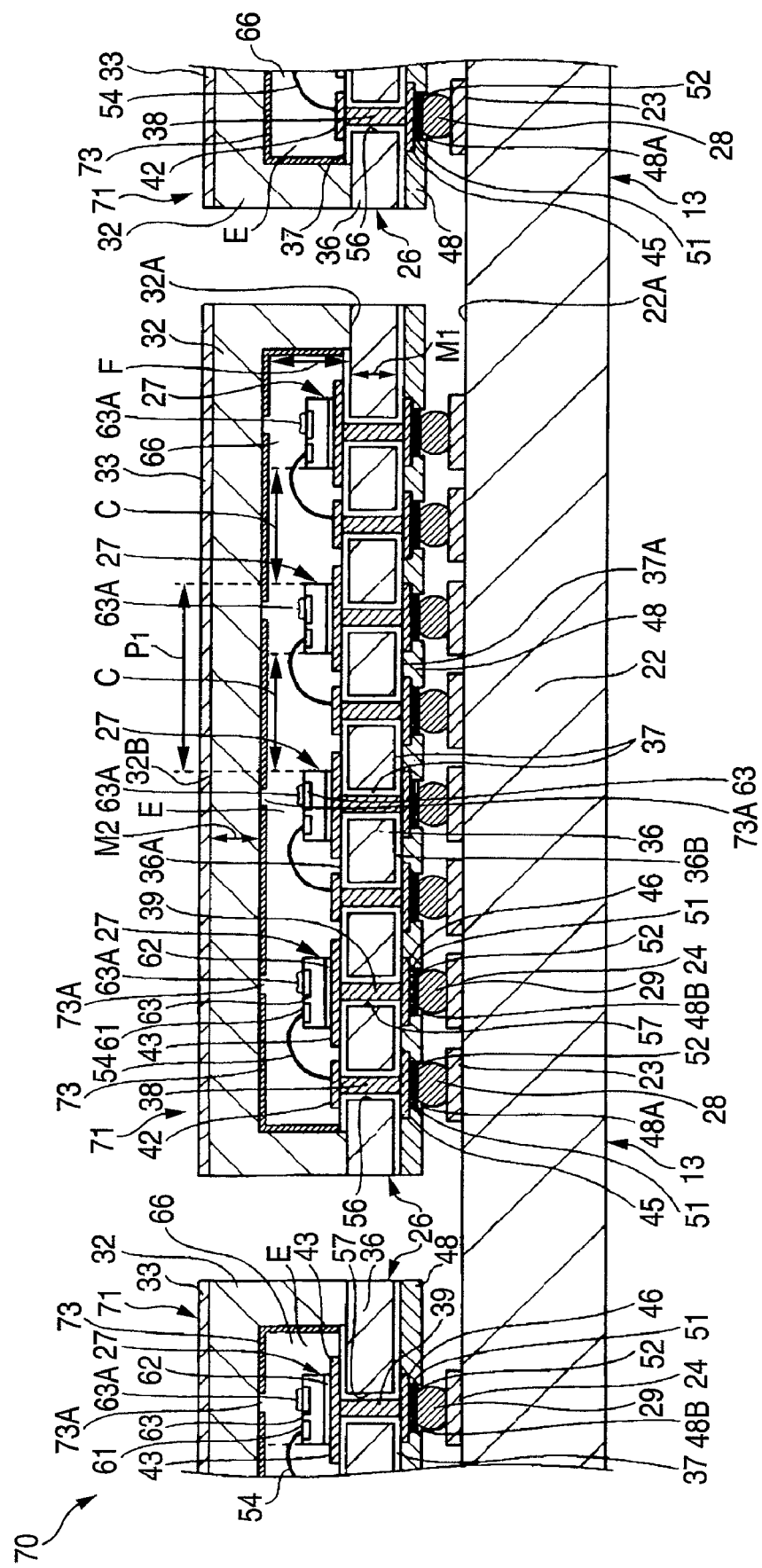
FIG. 7 is a sectional view of an illuminance detecting apparatus according to a second embodiment of the present invention.

FIG. 7 is a sectional view of an illuminance detecting apparatus according to a second embodiment of the present invention. In FIG. 7, the same reference symbols are affixed to the same constituent portions as those of the illuminance detecting apparatus 12 in the first embodiment.

By reference to FIG. 7, an illuminance detecting apparatus 70 of the second embodiment is configured similarly to the illuminance detecting apparatus 12 except that a plurality of illuminance detecting components 71 are provided instead of the plurality of illuminance detecting components 14 provided to the illuminance detecting apparatus 12 of the first embodiment.

The illuminance detecting component 71 is configured similarly to the illuminance detecting component 14 except that a light shielding member 73 is provided to the configuration of the illuminance detecting component 14 described in the first embodiment.

The light shielding member 73 is provided to cover an inner surface of the translucent member 32 opposing to the recess 66, except respective portions, which oppose to the light receiving portions 63 of the light receiving elements 27, of the translucent member 32. The light shielding member 73 is provided to cut off the light irradiated from the exposure apparatus 10.

Figure 8:
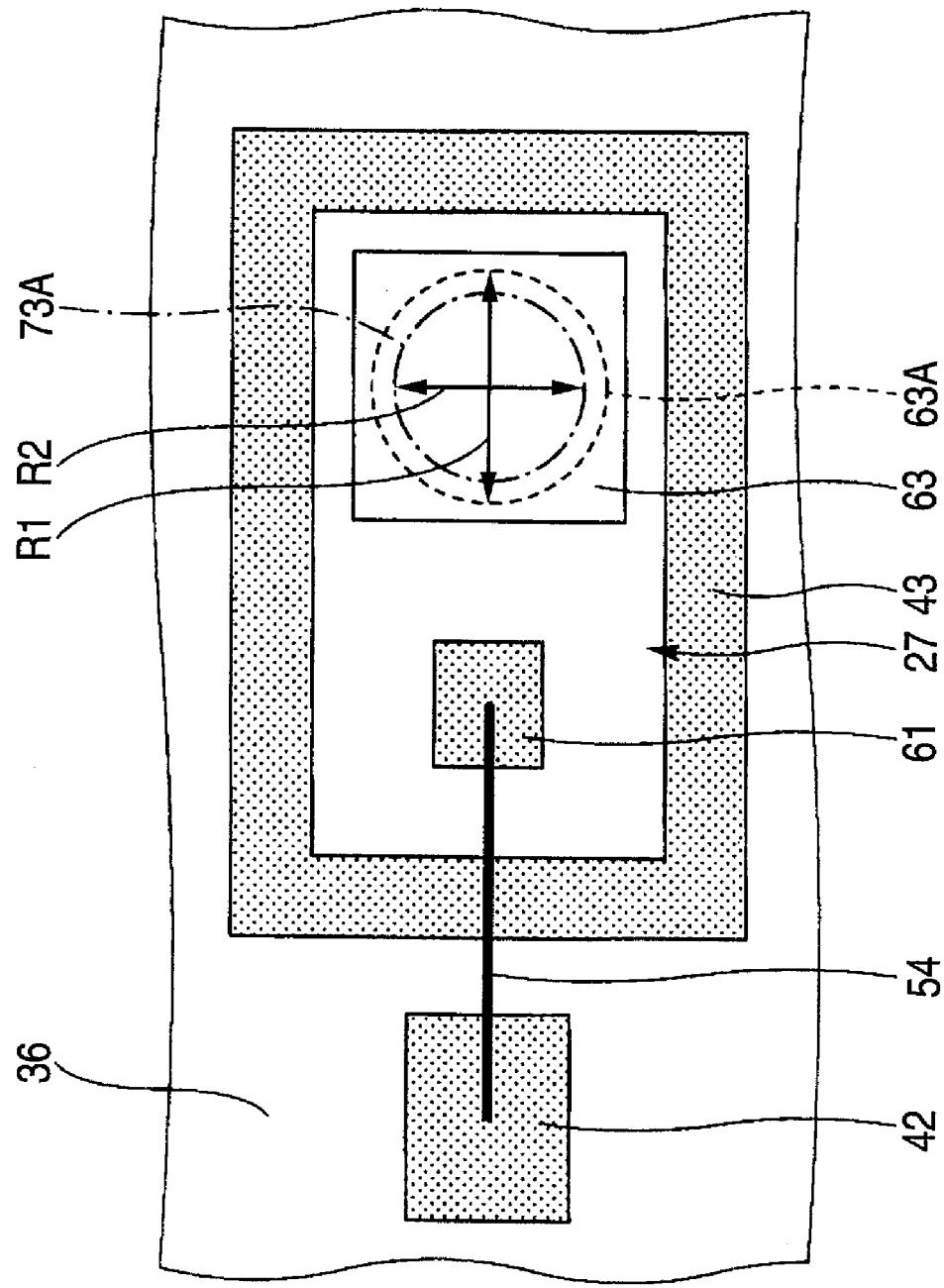
FIG. 8 is a view showing a positional relationship between a light receiving portion of the light receiving element and an opening portion formed in a light shielding member, when viewed from the top.

FIG. 8 is a view showing a positional relationship between a light receiving portion of the light receiving element and an opening portion formed in a light shielding member when viewed from the top. In FIG. 8, the same reference symbols are affixed to the same constituent portions as those of the illuminance detecting apparatus 70 shown in FIG. 7.

By reference to FIG. 7 and FIG. 8, the light shielding member 73 has openings 73A at portions, which oppose to the light receiving portions 63 of the light receiving elements 27, to expose the translucent member 32. The openings 73A are formed to pass the light irradiated from the exposure apparatus 10 to the light receiving portions 63 of the light receiving elements 27.

In this manner, the light shielding member 73 has the openings 73A at portions that oppose to the light receiving portions 63 of the light receiving elements 27, and is provided to cover the inner surface of the translucent member 32 opposing to the recess 66. Therefore, the plurality of light receiving elements 27 can detect only the illuminance of light irradiated to the aligned position of each light receiving element 27 respectively. As a result, the illuminance of light in a narrow range can be detected.

Also, a diameter R2 of the opening portion 73A may be set smaller than the diameter R1 of the effective area 63A of the light receiving portion 63 of the light receiving element 27 (see FIG. 8). Accordingly, the light is not irradiated to the light receiving portion 63 except the effective area 63A, and thus reliability of the illuminance of light being detected by the plurality of light receiving elements 27 can be improved. When the diameter R1 of the effective area 63A is set to $\phi 0.8$ mm, the diameter R2 of the opening portion 73A may be set to $\phi 0.4$ mm, for example.

As the light shielding member 73 formed as above, for example, a silicon film may be used. In this case, a thickness of the silicon film may be set to 5 Å, for example. Also, the silicon film may be formed by the vapor deposition method, for example.

According to the illuminance detecting component of the present embodiment, the light shielding member 73 has the openings 73A at portions that oppose to the light receiving portions 63 of the light receiving elements 27, and is provided to cover the inner surface of the translucent member 32 opposing to the recess 66. Therefore, the plurality of light receiving elements 27 can detect only the illuminance of light irradiated to the aligned position of each light receiving element 27 respectively. As a result, the illuminance of light in a narrow arrange can be detected.

Also, according to the illuminance detecting apparatus of the present embodiment, there is provided each of the plurality of illuminance detecting components 71 has the light shielding member 73 in which the openings 73A. Therefore, the plurality of light receiving elements 27 can detect only the illuminance of light irradiated to the aligned position of each light receiving element 27 respectively. As a result, the illuminance of light in a narrow arrange can be detected.

In the present embodiment, while there has been described the case where the illuminance of light irradiated from the exposure apparatus 10 is detected, the light detected by the illuminance detecting apparatus 70 and the illuminance detecting component 71 is not limited to the present exemplary embodiment. For example, the illuminance of light irradiated from the ultraviolet irradiation equipment used for curing a UV resin may be detected by the illuminance detecting apparatus 70 and/or the illuminance detecting component 71.

Third Embodiment

Figure 9:
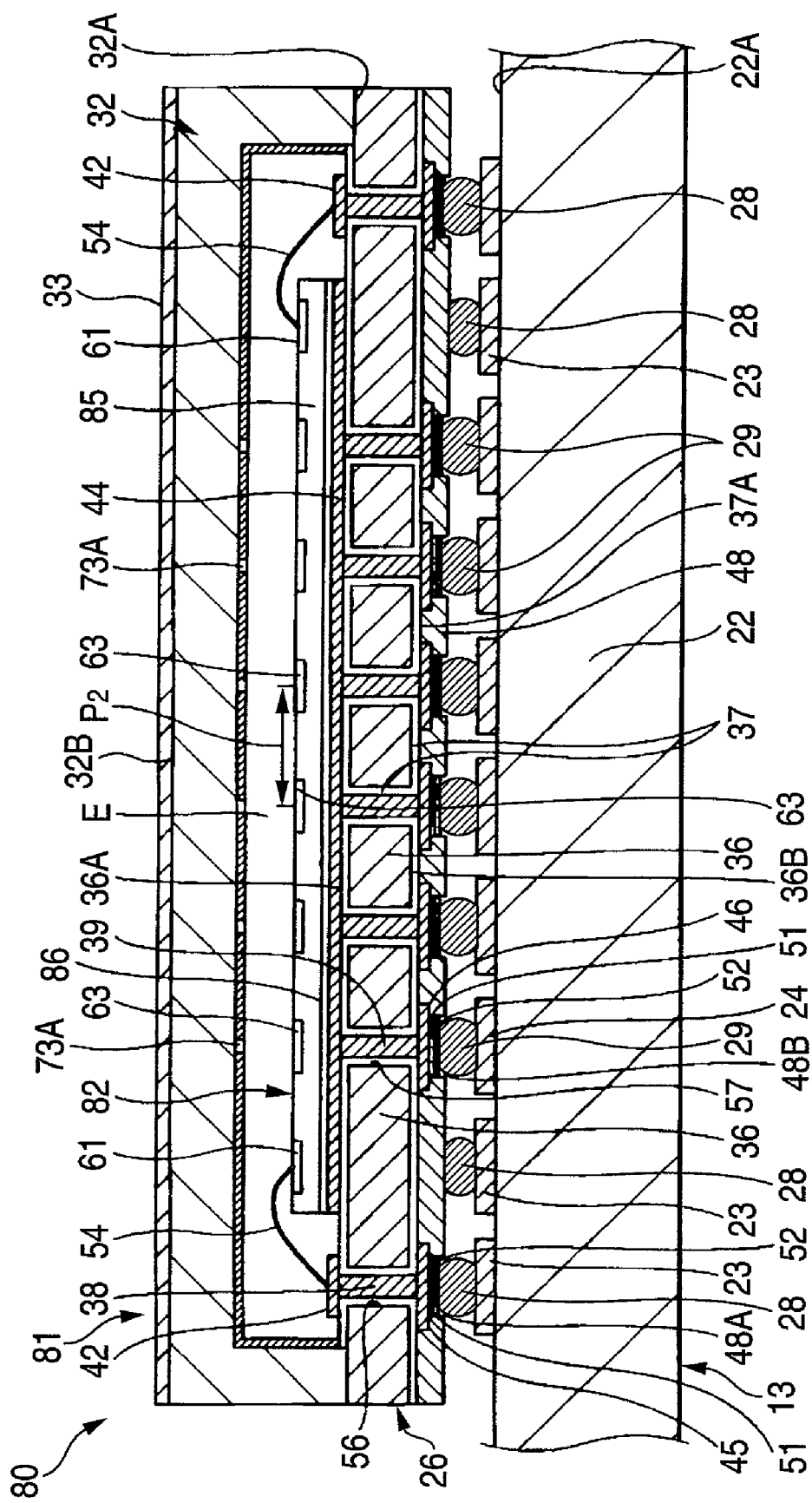
FIG. 9 is a sectional view of an illuminance detecting apparatus according to a third embodiment of the present invention.
Figure 10:
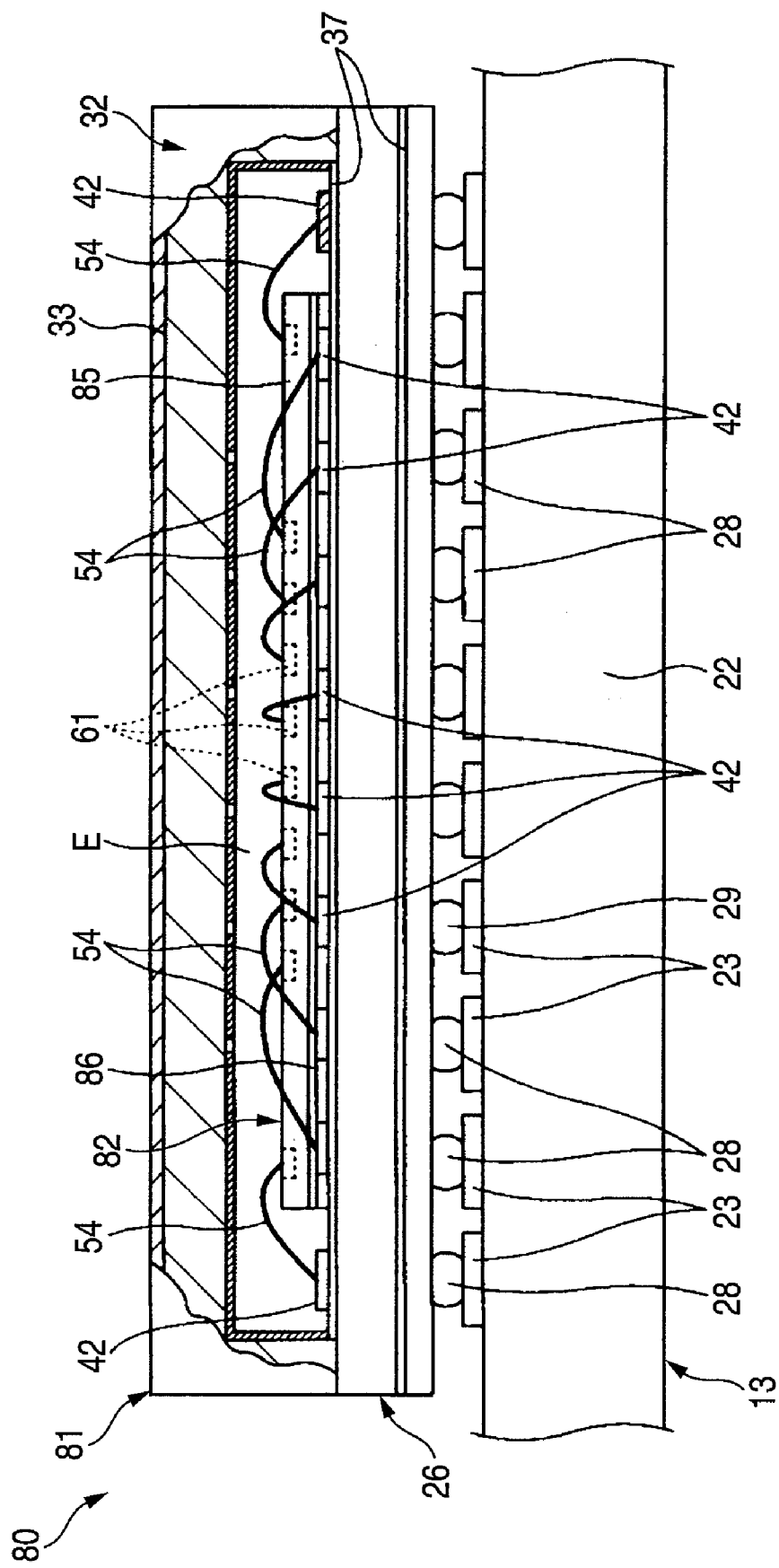
FIG. 10 is a side view of the illuminance detecting apparatus according to the third embodiment of the present invention, where a part of a translucent member is shown as a sectional view.
Figure 11:
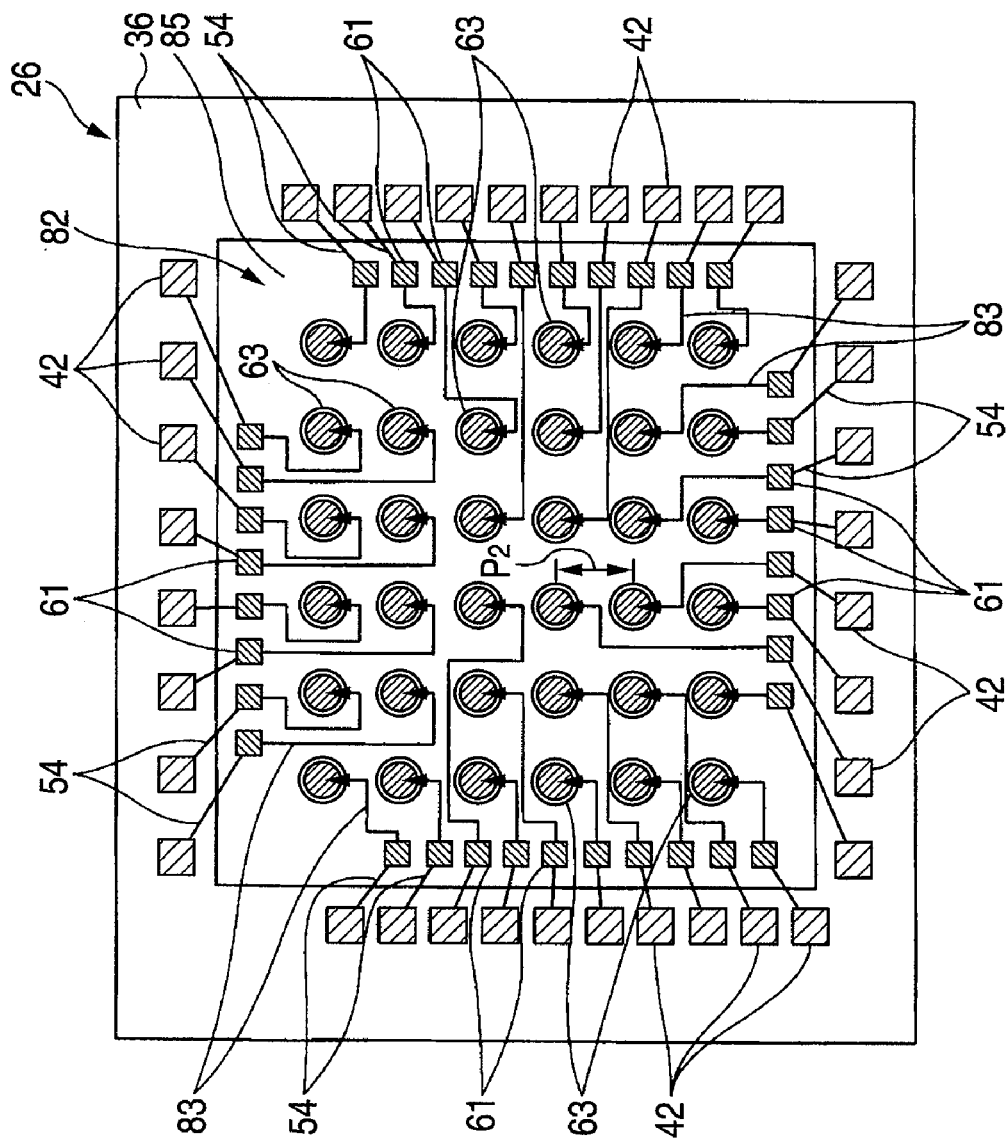
FIG. 11 is a plan view of the supporting substrate 26 used in the illuminance detecting apparatus according to the third embodiment of the present invention.

FIGS. 9 to 11 are views describing an illuminance detecting apparatus according to a third embodiment of the present invention. FIG. 9 is a sectional view of an illuminance detecting apparatus 80 according to the third embodiment of the present invention, FIG. 10 is a side view of the illuminance detecting apparatus 80 (a part of a translucent member 32 is shown as a sectional view), and FIG. 11 is a plan view of the supporting substrate 26 (a situation that the translucent member 32 is removed is shown). In FIGS. 9 to 11, the same reference symbols are affixed to the configurations corresponding to those of the illuminance detecting apparatus 12 and 70 according to the first and second embodiments shown in FIGS. 4 to 8, and their description will be omitted herein.

According to the illuminance detecting apparatus 12 and the illuminance detecting apparatus 70 according to the first and second embodiments, each light receiving element 27 has one light receiving surface (light receiving portion) 63 and the plurality of light receiving elements 27 are arranged on the supporting substrate 26 in array fashion. Accordingly, a size reduction of the illuminance detecting apparatuses 12 and 70 can be achieved as compared with the illuminance detecting apparatus in the related art.

Meanwhile, the illuminance detecting apparatus 80 according to the present embodiment is characterized in that a photo diode chip 82, in which a plurality of light receiving portions 63 are formed on a same substrate 85 (chip) in array fashion, is used as the light receiving element mounted on the supporting substrate 26 constituting an illuminance detecting component 81.

As shown in FIG. 11, the plurality of light receiving portions 63 are arranged on the photo diode chip 82 in array fashion, more particularly like a lattice of vertical 6×horizontal 6. The positive electrodes 61 of respective light receiving portions 63 are led to the outer peripheral portion by lead wirings 83 formed on a front surface of the substrate 85, and are connected to the pads 42 formed on the outer periphery. Also, the negative electrodes of respective light receiving portions 63 are connected to a negative electrode pattern 86 formed on the rear surface of the substrate 85.

In the present embodiment, as shown in FIGS. 9 and 10, the negative electrode pattern 86 is formed as a solid layer that is formed on the overall area of the lower surface of the substrate 85. Also, the negative electrode pattern 86 is connected electrically to the pads 44 that are formed on the upper surface 36A of the substrate body 36 in accordance with alignment position of the photo diode chip 82. The pads 44 are connected to the external connection terminals 29 via the through vias 39. Accordingly, the negative electrode of the photo diode chip 82 is connected electrically to the external connection terminals 29.

In the present embodiment, while the negative electrode pattern 86 and the pad 44 are formed in area substantially equal to an area of the photo diode chip 82, they are not always limited to the present exemplary embodiment. The negative electrode pattern 86 and the pad 44 may be formed partially.

Meanwhile, the positive electrode 61 formed on the periphery of the substrate 85 is connected to the pads 42 formed on the substrate body 36 by using the metal wire 54. Respective pads 42 are connected to the external connection terminals 28 via the through vias 38. Therefore, the positive electrodes 61 of the photo diode chips 82 are connected electrically to the external connection terminals 28. According to this configuration, when the supporting substrate 26 is viewed from the rear side, the external connection terminals 29 are arranged on the inner side and the external connection terminals 28 are arranged on their outer side.

Also, in the present embodiment, the translucent member 32 is made of glass, and the translucent member 32 is constructed integrally with the supporting substrate 26 when the face 32A is anode-bonded to the upper surface 36A of the substrate body 36 whose face 32A is made of silicon. Also, the light shielding member 73 is formed in the position of the translucent member 32 opposing to the photo diode chip 82. Also, the opening portion 73A having a narrower area than the effective area 63A of the light receiving portion 63 is formed in the position of the light shielding member 73 opposing to the light receiving portions 63.

In the illuminance detecting component 81 constructed as above according to the present embodiment, the photo diode chip 82 is used in which a plurality of light receiving portions 63 as the light receiving elements are formed on the same substrate 85 (chip) in array fashion. Therefore, an alignment pitch P2 (indicated with an arrow in FIG. 9 and FIG. 11) of the neighboring light receiving portions 63 can be further narrowed. In other words, in the first and second embodiments, since the metal wire 54 must be provided between the neighboring light receiving elements 27, a space where the metal wire 54 is arranged is required in the substrate body 36.

Meanwhile, in the photo diode chip 82 used in the present embodiment, it is not required to provide the space where the metal wire 54 is formed on the substrate 85, and also the leading wiring 83 can be provided as the finer pattern wiring. As a result, the alignment pitch P2 of the neighboring light receiving portions 63 can be shortened on the substrate 85, and therefore a distribution of the illuminance can be detected with higher precision.

Also, in the first and second embodiments, in mounting the light receiving elements 27 on the substrate body 36, the plurality of light receiving elements 27 is required to be positioned respectively and then mounted. In the present embodiment, one photo diode chip 82 may be positioned on the substrate body 36 and then mounted. Therefore, simplification of the assembling operation can be achieved by using the configuration of the present embodiment.

Fourth Embodiment

FIG. 12 is a view describing an illuminance detecting apparatus according to a fourth embodiment of the present invention. FIG. 12 is a sectional view of an illuminance detecting apparatus 90 according to the fourth embodiment. Also, in FIG. 12, the same reference symbols are affixed to the configurations corresponding to those of the illuminance detecting apparatus 12, 70 and 80 according to the first, second and third embodiments shown in FIGS. 4 to 11, and their description will be omitted herein.

In the above described embodiments, the supporting substrate 26 is shaped like a flat plate, and the recess 66 constituting the space E in which the light receiving elements 27, and the like are accommodated is formed in the translucent member 32. Meanwhile, in the present embodiment, a recess 67 is formed in a supporting substrate 26A, and a translucent member 32A is shaped into a flat plate. In this manner, the recess constituting the space E is not always provided to the translucent member 32, and may be formed on the supporting substrate 26A.

In this case, the present embodiment is applicable to the illuminance detecting apparatuses 12 and 70 (see FIGS. 5 and 7) described above in the first and second embodiments. In other words, the recess can be formed on the supporting substrate 26 and the translucent member 32 can be shaped into a flat plate.

The present invention is applicable to the illuminance detecting component and the illuminance detecting apparatus for detecting an illuminance of light irradiated from the outside.

While there has been described in connection with the exemplary embodiments of the present invention, it will be obvious to those skilled in the art that various changes and modification may be made therein without departing from the present invention. It is aimed, therefore, to cover in the appended claim all such changes and modifications as fall within the true spirit and scope of the present invention.

What is claimed is:

1. An illuminance detecting component, comprising:
a supporting substrate comprising:
a substrate body made of silicon; and
pads provided on an upper surface of the substrate body;
a plurality of light receiving elements connected electrically to the pads and receiving light irradiated from an outside, said plurality of light receiving elements being arranged in array fashion on the upper surface side;
external connection terminals connected electrically to the light receiving elements; and
a translucent member provided on the substrate body, wherein
an airtight space in which the plurality of light receiving elements are accommodated is formed between the translucent member and the substrate body; and
wherein
each of the plurality of light receiving elements has a light receiving portion for receiving said light, and
a light shielding member for shielding the light is provided on a first surface of the translucent member opposing the light receiving elements, and openings for passing the light are provided at locations of the light shielding member in one-to-one correspondence with the light receiving elements and opposing the light receiving portions, such that portions of the light shielding member cover portions of the light receiving elements and each of the openings is aligned with a respective said light receiving portion, and vice-versa, in one-to-one correspondence, as viewed from the outside in a direction normal to the light receiving elements, and each of the openings is smaller than an area of its said respective light receiving portion, so that the portions of the light shielding member cover the light receiving elements and portions of the light receiving portions except for areas of the light receiving portions that are exposed to the openings.

2. The illuminance detecting component of claim 1, wherein the pads are formed of a plating film.

3. The illuminance detecting component of claim 1, wherein
the translucent member has a recess for accommodating the plurality of light receiving elements therein, and
the supporting substrate is shaped like a flat plate.

4. The illuminance detecting component of claim 1, wherein
the supporting substrate has a recess for accommodating the plurality of light receiving elements therein, and
the translucent member is shaped like a flat plate.

5. The illuminance detecting component according to claim 1, wherein a diameter of each of the openings is smaller than that of each of effective areas of the light receiving portions.

6. The illuminance detecting component according to claim 1, wherein
the translucent member is made of glass, and
the substrate body and the translucent member are anode-bonded to each other.

7. The illuminance detecting component according to claim 1, wherein
the supporting substrate further comprises through vias provided to pass through the substrate body, and connected electrically to the pads, and
ends of the through vias positioned on a lower surface opposite to the upper surface of the substrate body are connected electrically to the external connection terminals.

8. The illuminance detecting component according to claim 1, wherein
an antireflective coating is formed on a second surface of the translucent member opposite to the first surface so as to prevent such a situation that said light is reflected at the second surface.

9. An illuminance detecting apparatus, comprising:
a plurality of the illuminance detecting components of claim 1; and
an aligning plate comprising:
a plate whose outer shape is substantially equal to a wiring substrate exposed by an exposure apparatus; and
wiring patterns provided on the plate and connected electrically to the external connection terminals provided in the illuminance detecting components.

10. The illuminance detecting component of claim 1, wherein
the plurality of light receiving elements project upward from the pads into the airtight space and some of the airtight space is present between tops of the light receiving elements and the translucent member.

11. An illuminance detecting component, comprising:
a supporting substrate;
a light receiving element disposed on the supporting substrate and having a plurality of light receiving portions for receiving light irradiated from an outside;
a translucent member bonded to the supporting substrate such that the light receiving element is sealed airtightly in a space formed between the translucent member and the supporting substrate, the translucent member being formed of a material for transmitting said light;
a light shielding member for shielding the light is provided on a first surface of the translucent member opposing the light receiving elements, and openings for passing the light are provided at locations of the light shielding member opposing the light receiving portions, such that portions of the light shielding member cover portions of the light receiving element and each of the openings is aligned with a respective said light receiving portion, and vice-versa, in one-to-one correspondence, as viewed from the outside in a direction normal to the light receiving element, and each of the openings is smaller than an area of its said respective light receiving portion, so that the portions of the light shielding member cover the light receiving elements and portions of the light receiving portions except for areas of the light receiving portions that are exposed to the openings; and
external connection terminals connected electrically to the light receiving element,
wherein
the plurality of light receiving portions are formed in array fashion on said light receiving element.

12. The illuminance detecting component according to claim 11, wherein
the supporting substrate and the translucent member are anode-bonded to each other.

13. The illuminance detecting component of claim 11, wherein
the translucent member has a recess for accommodating the light receiving element therein, and
the supporting substrate is shaped like a flat plate.

14. The illuminance detecting component of claim 11, wherein
   the supporting substrate has a recess for accommodating the light receiving element therein, and
   the translucent member is shaped like a flat plate.

15. The illuminance detecting component of claim 11, wherein
   the supporting substrate has a substrate body made of silicon, and
   the translucent member is made of glass.

16. The illuminance detecting component according to claim 11, wherein
   an antireflective coating is formed on a second surface of the translucent member opposite to the first surface so as to prevent such a situation that said light is reflected at the second surface.

17. An illuminance detecting apparatus, comprising:
   a plurality of the illuminance detecting components of claim 11; and
   an aligning plate comprising:
      a plate whose outer shape is substantially equal to a wiring substrate exposed by an exposure apparatus; and
      wiring patterns provided on the plate and connected electrically to the external connection terminals provided in the illuminance detecting components.

18. The illuminance detecting component of claim 11, wherein
   the light receiving element projects upward from the supporting substrate into the airtight space and some of the airtight space is present between top of the light receiving element and the translucent member.

* * * * *